United States Patent
Takahashi (10) Patent No.: US 8,957,746 B2
(45) Date of Patent: Feb. 17, 2015

(54) PARALLEL 1/4 WAVELENGTH LINE FREQUENCY FILTER

(75) Inventor: Yasuhiro Takahashi, Ageo (JP)

(73) Assignee: Canon Kabushiki Kaisha, Tokyo (JP)

( * ) Notice: Subject to any disclaimer, the term of this patent is extended or adjusted under 35 U.S.C. 154(b) by 319 days.

(21) Appl. No.: 13/352,318

(22) Filed: Jan. 17, 2012

(65) Prior Publication Data

US 2012/0206218 A1 Aug. 16, 2012

(30) Foreign Application Priority Data

Feb. 10, 2011 (JP) ................... 2011-026762

(51) Int. Cl.
   *H05K 1/00* (2006.01)
   *H01P 1/203* (2006.01)

(52) U.S. Cl.
   CPC ............ *H01P 1/2039* (2013.01); *H01P 1/203* (2013.01); *H05K 1/00* (2013.01)
   USPC ........................................... 333/204; 333/27

(58) Field of Classification Search
   USPC ....................... 333/204, 25, 26, 27
   See application file for complete search history.

(56) References Cited

U.S. PATENT DOCUMENTS

| | | | |
|---|---|---|---|
| 4,467,296 A * | 8/1984 | Cohen et al. .......... | 333/202 |
| 4,733,209 A * | 3/1988 | Paynting .............. | 333/205 |
| 5,392,148 A | 2/1995 | Takahashi et al. | |
| 6,392,507 B1 | 5/2002 | Kim | |
| 7,109,718 B2 | 9/2006 | Shimizu et al. | |
| 2009/0121811 A1* | 5/2009 | Choi et al. .......... | 333/204 |

FOREIGN PATENT DOCUMENTS

| | | |
|---|---|---|
| CN | 1284797 A | 2/2001 |
| CN | 2798334 A | 7/2006 |
| CN | 101764276 A | 6/2010 |
| JP | 626356 A | 1/1987 |
| JP | 5-199003 A | 8/1993 |
| JP | 9-232804 A | 9/1997 |
| WO | 2005/013411 A | 2/2005 |
| WO | 2008/088144 A1 | 7/2008 |

OTHER PUBLICATIONS

European Search Report dated May 11, 2012 issued in corresponding European Patent Application No. 12153271.7.
Bell, H.C., L-Resonator Bandstop Filters, IEEE Transaction on Microwave Theory and Techniques (XP 000636439), vol. 44, No. 12, pp. 2669-2672, Dec. 1996.
Mehdizadeh, M., et al., High Speed Varactor Tuned Notch Filter, IEEE MTT-S Digest, International Microwave Symposium (XP 002192388), pp. 531-534, 1985.
Chinese Office Action dated Dec. 4, 2013 issued in corresponding Chinese Patent Application No. 201210026873.0.

* cited by examiner

*Primary Examiner* — Stephen E Jones
*Assistant Examiner* — Scott S Outten
(74) *Attorney, Agent, or Firm* — Fitzpatrick, Cella, Harper & Scinto

(57) ABSTRACT

Provided is a printed circuit board configured to remove undesired signals generated in a transmission line, the signals having frequencies that are integral multiples of a basic frequency. Two ¼ wavelength lines 5 and 6 each having a length that is ¼ of a basic frequency corresponding to a data rate of coded digital signal are arranged at a signal wiring layer, which is one of surface layers of a substrate 8, along a transmission line 3 for transmitting the digital signal. One end 15*a* of the first ¼ wavelength line 5 is opened, and another end 15*b* is grounded to a ground 7. Both ends 16*a* and 16*b* of the second ¼ wavelength line 6 are opened.

9 Claims, 9 Drawing Sheets

PARALLEL 1/4 WAVELENGTH LINE FREQUENCY FILTER

BACKGROUND OF THE INVENTION

1. Field of the Invention

The present invention relates to a printed circuit board including a transmission line that transmits a digital signal.

2. Description of the Related Art

Because of there being a demand for high speed and high definition, the recent digital complex machines and digital cameras are required to transmit signals having large-volume digital signals at high speed. In order to transmit such large-volume data at high speed, it is necessary to increase the number of transmission lines or the transmission speed. Printed circuit boards with their sizes reduced and their densities increased have a limitation in increasing the number of transmission lines. Furthermore, where a cable is used for transmission, an increase in the number of cable cores leads directly to an increase in cost. Furthermore, as the transmission speed increases, significant signal timing differences occur due to skew, resulting in difficulty in providing a setup time and a hold time. Therefore, serial transmission, which enables high-speed transmission of large-volume data with a small number of transmission lines, is widely used.

Serial transmission is a transmission method in which low-speed parallel signals such as a data signal, an address signal and a control signal are serialized in a transmission line to provide a differential output, and the transmitted serial signal is deserialized into parallel signals on the reception side. In this serial transmission method, a serialized data string with a clock signal embedded therein is transmitted and clocks and data are reproduced on the reception side.

Meanwhile, where a high-speed signal is transmitted in a long, lossy transmission line such as a cable, a part of components of the signal may be radiated with the cable as an antenna, affecting the operation of other apparatuses. Therefore, it is necessary to suppress EMI (electromagnetic interference) from the relevant apparatus.

In the clock-embedded serial transmission, data and synchronizing clocks are serialized together, data coded so as to exhibit a logical transition ratio of approximately 50% for each of a high level and a low level is transmitted. Thus, in the transmitted serial data, there are no consecutive multiple bits remaining at a low level or a high level, and a repetitive waveform having a basic cycle of one bit dominantly appears. Accordingly, strong EMI from a serial transmission system is observed in domains of frequencies that are integral multiples of the one-bit cycle of the serial data. Also, it is known that data transmitted by means of a rectangular wave has a spectrum expressed by a sin c function, and has no spectrum in domains of frequencies that are integral multiples of a one-bit cycle. In other words, EMI occurs in the domains of frequencies where there is no spectrum of the transmitted signal. For example, where a transmission rate is 500 Mbps, a cycle of one bit is 0.5 GHz (basic frequency), there is no spectrum of the transmitted signal in domains of frequencies that are integral multiples of the one-bit cycle, and strong EMI occurs in the domains. Where this clock-embedded serial transmission method is employed, EMI occurs in domains of frequencies where there is no spectrum of a transmitted signal, and thus, a band-elimination filter or a notch filter can be used for the differential transmission line. This is because such a band-elimination filter or notch filter filters out a band in the vicinity of frequencies where there is no spectrum of the transmitted signal, enabling actively EMI to be removed without imposing effects on the transmitted signal.

Therefore, it is conventionally known that a band-elimination filter has a configuration in which a serial circuit of a coil and a capacitor is connected in parallel to a transmission line or a configuration in which a parallel circuit of a coil and a capacitor is connected in series to a transmission line. However, in such a band-elimination filter, each circuit element includes a lumped element such as a chip part, and thus, in a high-frequency domain such as a GHz band, a constant value of the part has a very small value. Accordingly, it is difficult to provide desired frequency filter-out by means of its standard parts. Furthermore, it is also difficult to provide desired frequency filter-out because of variation in element values of the parts.

As a solution to the above problem, in order to provide desired characteristics in high-frequency domains and solve the problem of variation in element values of the parts, the technique of forming a band-elimination filter using a distributed element circuit is known. For a high-frequency band such as a GHz band, it is common to form a distributed element circuit using a stripe line formed on a substrate as a distributed element. Where a distributed element circuit is formed using a distributed element, values corresponding to element values of a lumped element are determined by physical dimensions such as a width of the stripe line and the length of the stripe line, and desired frequencies to be filtered out can be controlled by the dimensions to be provided, enabling desired characteristics to be obtained easily.

Figure 12A:
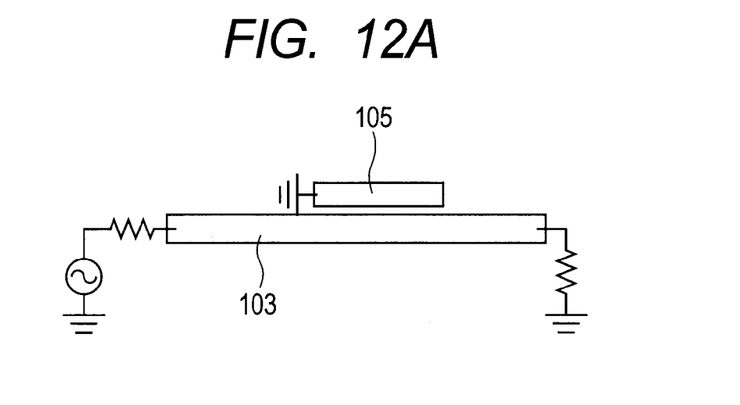
FIG. 12A is a conceptual diagram of a conventional printed circuit board.

Japanese Patent Application Laid-Open No. H09-232804 discloses a band-elimination filter including a distributed element, in which a line related to an electrical length of a frequency to be removed is arranged close to a principal transmission line to remove undesired frequency components. This configuration is illustrated in FIG. 12A. In this configuration, a line 105 with one end connected to a ground is arranged close to a principal transmission line 103.

As a passage characteristic of the transmission line configured as described above, the line with the end thereof connected to the ground and having an electrical length corresponding to $\lambda/4$ ($\lambda$: wavelength) of the basic frequency, attenuates the basic frequency and frequencies that are odd multiples of the basic frequency.

Figure 12B:
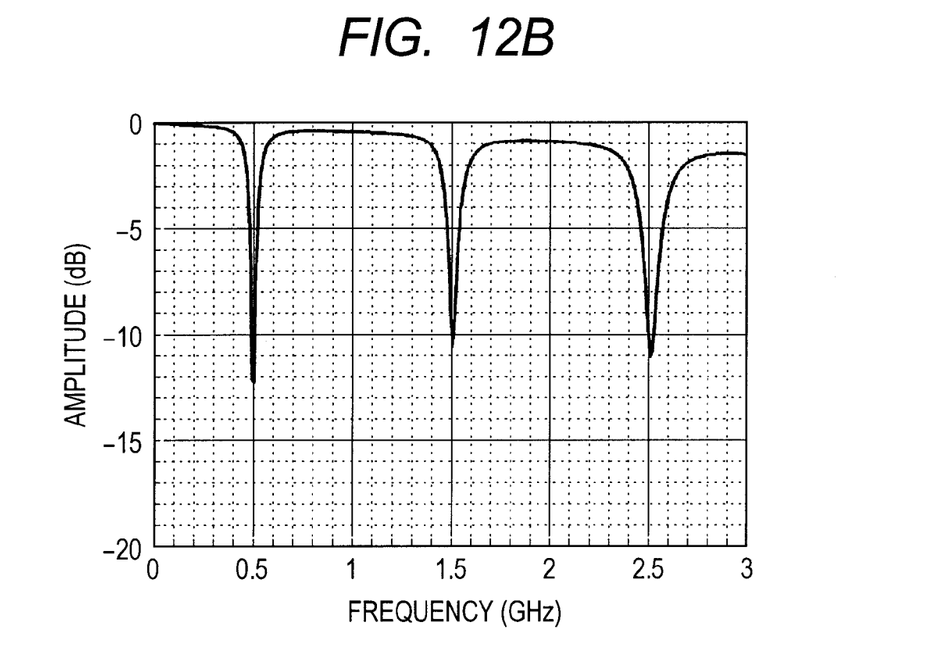
FIG. 12B is a graph indicating results of transmission line attenuation characteristic calculation.

However, the configuration illustrated in FIG. 12A is able to remove EMI in domains of frequencies that are odd multiples of the basic frequency, but cannot attenuate frequencies that are even multiples of the basic frequency, and thus has a problem of providing no EMI removal effect for the frequencies that are even multiples of the basic frequency. FIG. 12B indicates a transmission line attenuation characteristic of the conventional configuration illustrated in FIG. 12A. This characteristic is a band rejection characteristic with 0.5 GHz as a basic frequency, and exhibits attenuation for 1.5 GHz and 2.5 GHz, which are odd multiples of the basic frequency, but exhibits no attenuation for 1 GHz and 2 GHz, which are even multiples of the basic frequency. Accordingly, in the clock-embedded serial transmission, strong EMI occurs in the domains of frequencies that are integral multiples of a basic frequency corresponding to a data transmission rate, and components having frequencies that are even multiples of the basic frequency cannot be removed.

SUMMARY OF THE INVENTION

Therefore, an object of the present invention to provide a printed circuit board capable of attenuating a component having a frequency that is an integral multiple of a basic frequency corresponding to a data rate of a digital signal, for a transmission line.

In order to achieve the object, according to one aspect of the present invention, an printed circuit board comprises: a signal output port for outputting a digital signal; a signal input port for inputting the digital signal; a transmission line transmitting the digital signal outputted from the signal output port to the signal input port; a substrate on which the signal output port, the signal input port and the transmission line are arranged; a first ¼ wavelength line arranged on the substrate in parallel to the transmission line, wherein the first ¼ wavelength line has one end opened and the other end connected to grounded, and a length of the first ¼ wavelength line in a direction parallel to the transmission line is set as ¼ of a wavelength of a basic frequency corresponding to a data rate of the digital signal; and a second ¼ wavelength line arranged on the substrate in parallel to the transmission line, wherein the second ¼ wavelength line has both ends opened, and a length of the second ¼ wavelength line in the direction parallel to the transmission line is set as ¼ of the wavelength of the basic frequency corresponding to the data rate of the digital signal.

In order to achieve the object, according to the other one aspect of the present invention, an printed circuit board comprises: a signal output port for outputting a digital signal; a signal input port for inputting the digital signal; a transmission line transmitting the digital signal outputted from the signal output port to the signal input port; a substrate on which the signal output port, the signal input port and the transmission line are arranged; a first ¼ wavelength line arranged on the substrate in parallel to the transmission line, wherein the first ¼ wavelength line has one end opened and the other end connected to ground, and a length of the first ¼ wavelength line in the direction parallel to the transmission line is set as ¼ of a wavelength of a basic frequency corresponding to a data rate of the digital signal; and a second ¼ wavelength line arranged on the substrate in parallel to the transmission line, wherein the second ¼ wavelength line has both ends grounded, and a length of the second ¼ wavelength line in the direction parallel to the transmission line is set as ¼ of the wavelength of the basic frequency corresponding to the data rate of the digital signal.

In order to achieve the object, according to a further aspect of the present invention, an printed circuit board comprises: a signal output port for outputting a digital signal; a signal input port for inputting the digital signal; a transmission line transmitting the digital signal outputted from the signal output port to the signal input port; a substrate on which the signal output port, the signal input port and the transmission line are arranged; a first ¼ wavelength line arranged on the substrate in parallel to the transmission line; and a second ¼ wavelength line arranged on the substrate in parallel to the transmission line, wherein a capacitive element is corrected between one end of the first ¼ wavelength line and one end of the second ¼ wavelength line, the other end of the first ¼ wavelength line is grounded, and the other end of the second ¼ wavelength line is opened.

The present invention enables attenuation of a component having a frequency that is an integral multiple of a basic frequency corresponding to a data rate of a digital signal, for a transmission line.

Further features of the present invention will be apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1A:
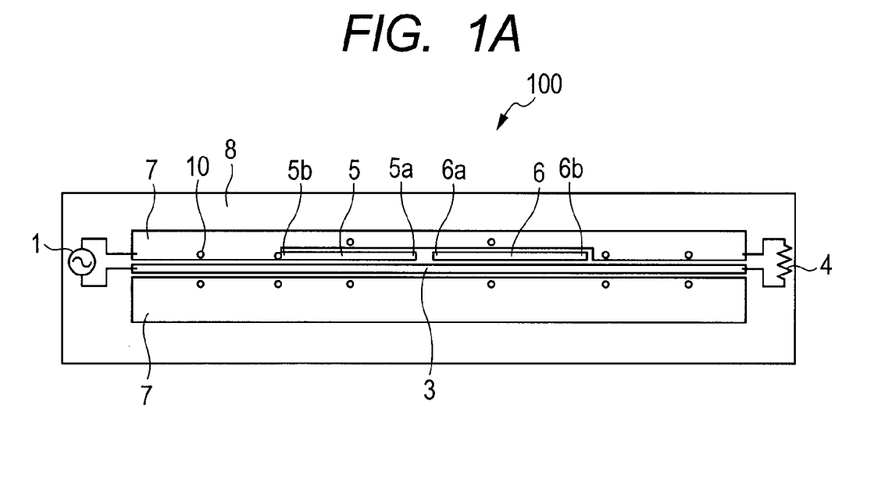
FIGS. 1A, 1B and 1C are conceptual diagrams each illustrating a schematic configuration of a printed circuit board according to a first embodiment of the present invention.
Figure 1B:
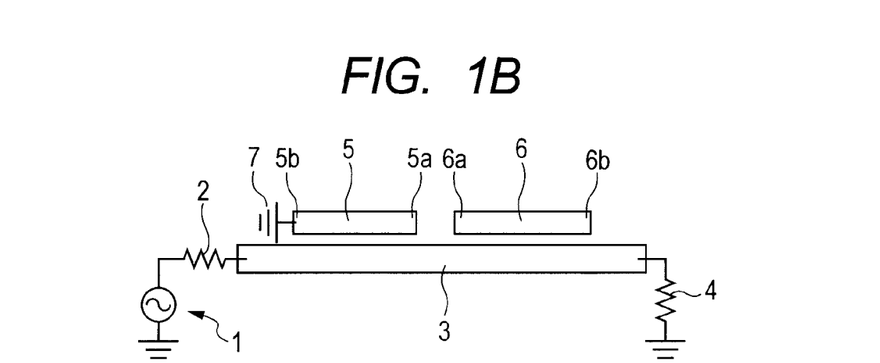
Figure 1C:
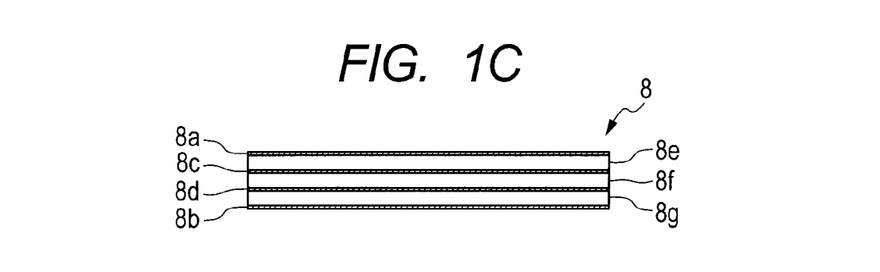

FIGS. 1A, 1B and 1C are conceptual diagrams each illustrating a schematic configuration of a printed circuit board according to a first embodiment of the present invention: FIG. 1A is a plan view of the printed circuit board; FIG. 1B is a schematic diagram of a circuit configuration of the printed circuit board; and FIG. 1C is a schematic cross-sectional diagram illustrating a substrate of the printed circuit board.

As illustrated in FIG. 1A, a printed circuit board 100 includes a signal source 1, which is a signal output port for outputting a digital signal, and a termination resistor 4, which is a signal input port for inputting the digital signal outputted from the signal source 1. The printed circuit board 100 also includes a transmission line 3 connected between the signal source 1 and the termination resistor 4, the transmission line 3 transmitting the digital signal outputted from the signal source 1 to the termination resistor 4. The signal source 1, the termination resistor 4 and the transmission line 3 are arranged at a signal wiring layer 8a of a substrate 8, which is illustrated in FIG. 1C. The substrate 8 is a multilayer substrate in which signal wiring layers 8a and 8b are provided as opposite surface layers and a ground layer 8c and a power supply layer 8d are provided as inner layers, and the signal wiring layer 8a, the ground layer 8c, the power supply layer 8d and the signal wiring layer 8b are stacked via insulating layers 8e, 8f and 8g. In FIG. 1B, a resistance 2 exhibits an impedance for the signal source 1, and has an impedance value that is the same as that of the transmission line 3.

Here, a digital signal is a signal in which data and synchronizing clock are serialized together, the signal being coded so as to exhibit a logical transition ratio of approximately 50% for each of a high level and a low level. The below description will be provided assuming that the digital signal has a data rate of, for example, 500 Mbps and a basic frequency corresponding to the data rate is 0.5 GHz.

In the first embodiment, the printed circuit board 100 includes a first ¼ wavelength line 5 arranged at the signal wiring layer 8a of the substrate 8 in parallel to the transmission line 3, having a length in a direction parallel to the transmission line 3 set as ¼ of a wavelength of the basic frequency. One end 5a in the direction parallel to the transmission line 3 of the first ¼ wavelength line 5 is opened, and another end 5b in the direction parallel to the transmission line 3 is grounded to a ground 7.

Furthermore, the printed circuit board 100 includes a second ¼ wavelength line 6 arranged at the signal wiring layer 8a of the substrate 8 in parallel to the transmission line 3, and having a length in the direction parallel to the transmission line 3 set as ¼ of the wavelength of the basic frequency. Both ends 6a and 6b in the direction parallel to the transmission line 3 of the second ¼ wavelength line 6 are opened. The first ¼ wavelength line 5 and the second ¼ wavelength line 6 are arranged adjacent to each other.

Here, the transmission line 3, the first ¼ wavelength line 5 and the second ¼ wavelength line 6 are arranged at the signal wiring layer 8a (one and same layer), which is one of the surface layers of the substrate 8. The first ¼ wavelength line 5 and the second ¼ wavelength line 6 are arranged adjacent to the transmission line 3.

Grounds 7 are arranged at the signal wiring layer 8a, which is one of the surface layers of the substrate 8. The grounds 7 are arranged so as to surround the lines 3, 5 and 6, and function as guard grounds. The grounds 7 are electrically connected to the ground layer 8c of the substrate 8 via through holes 10.

In the above-described configuration, the first ¼ wavelength line 5 attenuates frequencies of 1.5 GHz, 2.5 GHz . . . , which are odd multiples of the basic frequency corresponding to the data rate of the digital signal passing through the transmission line 3. In other words, the first ¼ wavelength line 5 has a function that attenuates a frequency component exhibiting an anti-node of a sinusoidal voltage at the opened end 5a and a node of the same at the other end 5b grounded to the ground 7.

Meanwhile, the second ¼ wavelength line 6 is a ¼ wavelength line with both ends opened, for the basic frequency. The second ¼ wavelength line 6 attenuates frequencies of 1 GHz, 2 GHz . . . , which are even multiples of the basic frequency of the digital signal passing through the transmission line 3. In other words, the second ¼ wavelength line 6 has a function that attenuates a frequency component exhibiting anti-nodes of a sinusoidal voltage at both the ends 6a and 6b.

Figure 2:
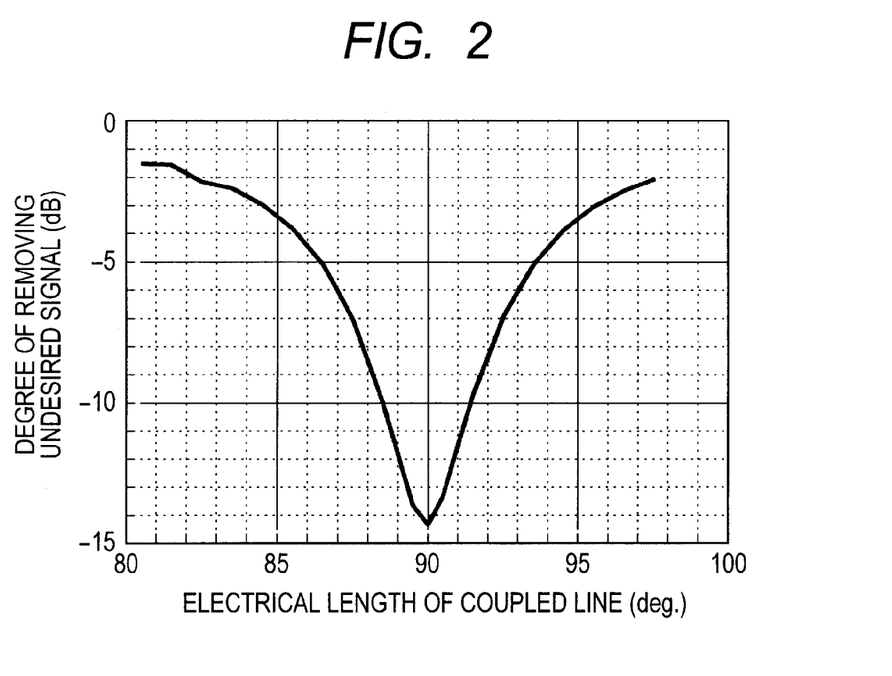
FIG. 2 is a graph illustrating attenuation of a basic frequency component in the first embodiment of the present invention.

FIG. 2 is a graph indicating attenuation of a basic frequency component relative to an electrical length of the first ¼ wavelength line 5. Here, the abscissa axis represents electrical length as the angle, and an electrical length of 90 degrees corresponds to a ¼ wavelength. Based on the graph, 3 dB or more of attenuation can be provided as long as the electrical length is in the range of no less than 85 degrees and no more than 95 degrees. Accordingly, in the first embodiment, the ¼ wavelength lines 5 and 6 with the respective lengths set as ¼ of the wavelength of the basic frequency include lines each having a tolerance in the range of no less than 85 degrees and no more than 95 degrees in electrical length.

Figure 3:
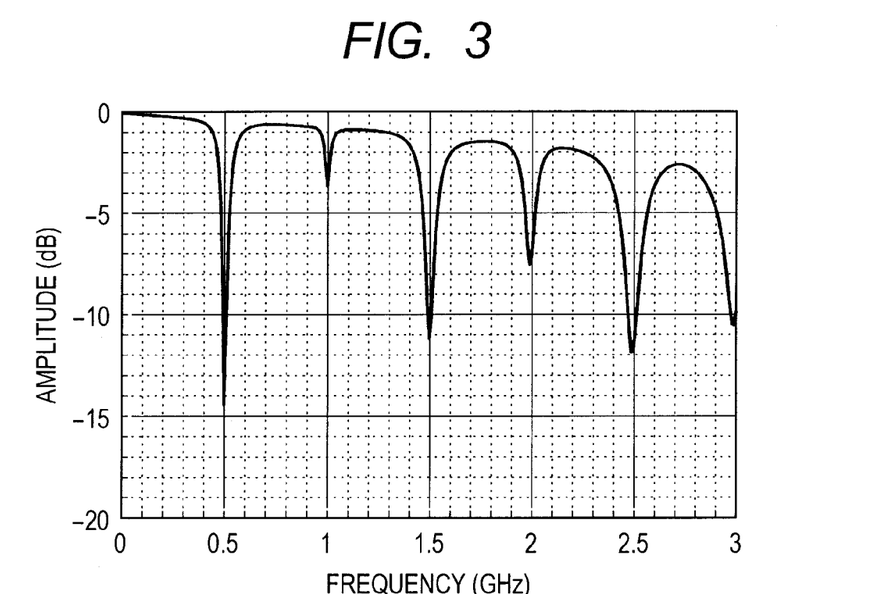
FIG. 3 is a graph indicating a transmission line attenuation characteristic in the first embodiment of the present invention.

FIG. 3 is a graph illustrating results of transmission line attenuation characteristic calculation. The calculation was performed assuming that the basic frequency is 0.5 GHz, and the first ¼ wavelength line 5 and the second ¼ wavelength line 6 were formed on a side of a double-sided glass epoxy substrate with a thickness of 1.6 mm. It was assumed that the first ¼ wavelength line 5 has a length of 84 mm and the second ¼ wavelength line 6 has a length of 86 mm. The lengths of the ¼ wavelength lines 5 and 6 were set so as to be 90 degrees in electrical length for 0.5 GHz. As is clear from FIG. 3, an attenuating effect is provided for frequencies that are integral multiples of the basic frequency (0.5 GHz).

As described above, in the first embodiment, the first ¼ wavelength line 5 and the second ¼ wavelength line 6 are arranged respectively adjacent to the transmission line 3. Consequently, components having frequencies that are odd multiples and even multiples of the basic frequency, that is, components having frequencies that are integral multiples of the basic frequency, can be attenuated for the principal transmission line 3.

Second Embodiment

Figure 4:
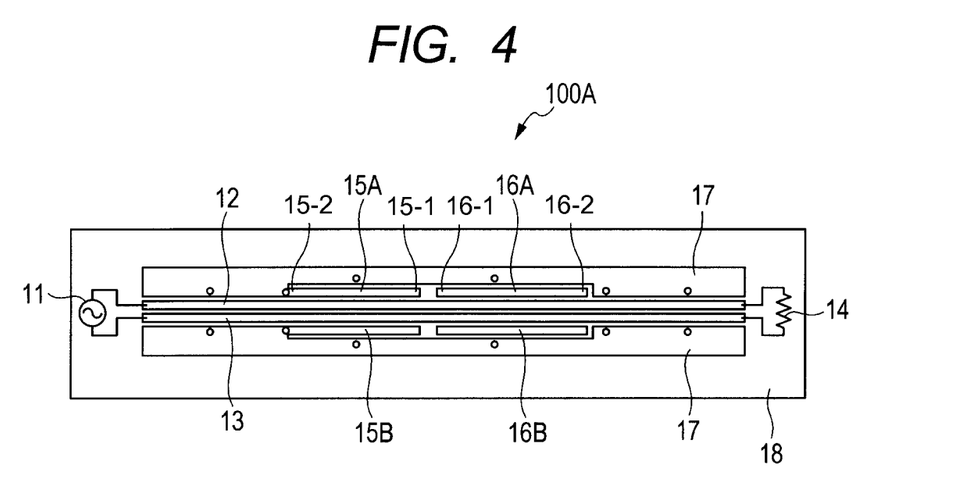
FIG. 4 is a plan view of a printed circuit board according to a second embodiment of the present invention.

Next, a printed circuit board according to a second embodiment of the present invention will be described. While the first embodiment has been described in terms of a case where a single-ended signal is transmitted as a digital signal, in the second embodiment, a case where a differential signal is transmitted will be described. FIG. 4 is a plan view of the printed circuit board according to the second embodiment of the present invention.

In recent years, with an increase in speed of digital data, differential transmission is frequently used for reduction of EMI and removal of interference. In the second embodiment, a printed circuit board 100A includes a pair of differential transmission lines 12 and 13 provided at a signal wiring layer, which is one of surface layers of a substrate 18. It is necessary that the pair of the differential transmission lines 12 and 13 be formed so that the differential transmission lines 12 and 13 are closely coupled to each other, and thus, the differential transmission lines 12 and 13 are arranged close to each other and in parallel to each other.

Also, the printed circuit board 100A includes a signal source 11, which is a signal output port, and a termination resistor 14, which is a signal input port. Digital signals having different polarities are transmitted to the respective differential transmission lines 12 and 13.

In the second embodiment, the printed circuit board 100A includes a first ¼ wavelength line 15A and a second ¼ wavelength line 16A, which are arranged adjacent to the transmission line 12. The printed circuit board 100A further includes a first ¼ wavelength line 15B and a second ¼ wavelength line 16B, which are arranged adjacent to the transmission line 13. These lines 12, 13, 15A, 16A, 15B and 16B are interposed between grounds (guard grounds) 17 for reducing electromagnetic radiation leaked from the lines. The grounds 17 are connected to a ground layer, which is an inner layer, via through holes 20.

Each of the ¼ wavelength lines 15A, 16A, 15B and 16B is set to have a length that is ¼ of a basic frequency corresponding to a digital signal. One end 15-1 of each of the first ¼ wavelength lines 15A and 15B is opened, and another end 15-2 thereof is grounded to the ground 17. Meanwhile, both ends 16-1 and 16-2 of each of the second ¼ wavelength lines 16A and 16B are opened. The ¼ wavelength lines 15A, 16A, 15B and 16B set to have a length that is ¼ of the basic frequency include lines each having a tolerance in the range of no less than 85 degrees and no more than 95 degrees in electrical length.

The above-described configuration enables signals that are integral multiples of a basic frequency, which are not necessary for transmission of digital signals in the differential transmission lines 12 and 13.

Third Embodiment

Figure 5:
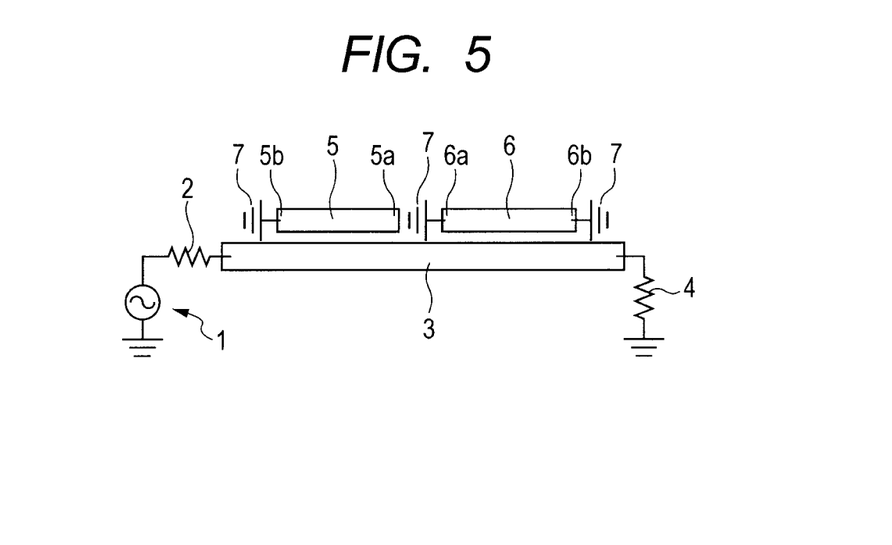
FIG. 5 is a schematic diagram illustrating a circuit configuration of a printed circuit board according to a third embodiment of the present invention.

Next, a printed circuit board according to a third embodiment of the present invention will be described. While the first and second embodiments have been described in terms of a case where both ends of the second ¼ wavelength line(s) are opened, the third embodiment will be described in terms of a case where both ends of a second ¼ wavelength line are grounded to grounds. FIG. 5 is a schematic diagram of a circuit configuration of the printed circuit board according to the third embodiment of the present invention. FIG. 5 illustrates a circuit that transmits a single-ended signal as a digital signal as in the first embodiment. Components similar to those in the first embodiment are provided with reference numerals that are the same as those in the first embodiment.

As illustrated in FIG. 5, in the third embodiment, both ends 6a and 6b of a second ¼ wavelength line 6 are grounded to a ground 7. Accordingly, the second ¼ wavelength line 6 has a function that attenuates a frequency component exhibiting nodes of a sinusoidal voltage at the respective ends 6a and 6b.

Accordingly, in the third embodiment, a first ¼ wavelength line 5 and the second ¼ wavelength line 6 are arranged adjacent to the transmission line 3. Consequently, components having frequencies that are odd multiples and even multiples of a basic frequency, that is, components having frequencies that are integral multiples of the basic frequency, can be attenuated for the principal transmission line 3.

It should be noted that a printed circuit board including a pair of differential transmission lines for transmitting a differential signal can exert an effect similar to that of the second embodiment, by grounding both ends of each of respective second ¼ wavelength lines to grounds.

Fourth Embodiment

Next, a printed circuit board according to a fourth embodiment of the present invention will be described. The first to third embodiments have been described in terms of a case where the first ¼ wavelength line(s) and the second ¼ wavelength line(s) are arranged at a layer of a substrate, the layer being the same as a layer where transmission line(s) are arranged. The fourth embodiment will be described in terms of a case where a first ¼ wavelength line and a second ¼ wavelength line are arranged at a layer of a substrate, the layer being different from a layer where a transmission line is arranged.

Figure 6A:
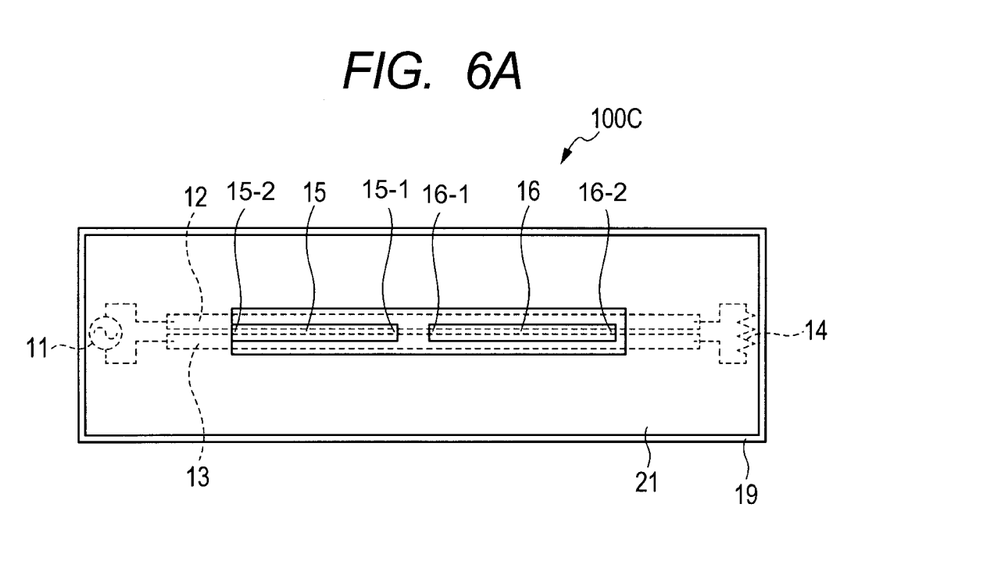
FIGS. 6A and 6B are conceptual diagrams each illustrating a schematic configuration of a printed circuit board according to a fourth embodiment of the present invention.
Figure 6B:
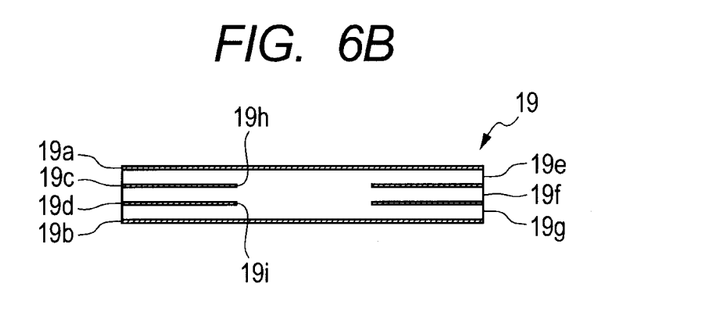

FIGS. 6A and 6B are diagrams each illustrating a schematic configuration of a printed circuit board 100C according to the fourth embodiment of the present invention: FIG. 6A is a plan view of the printed circuit board 100C; and FIG. 6B is a schematic cross-sectional view of a substrate 19 of the printed circuit board 100C. In the fourth embodiment, the substrate 19 of the printed circuit board 100C is a multilayer substrate including a signal wiring layer 19a, which is a surface layer, another signal wiring layer 19b, which is another surface layer, and a ground layer 19c and a power supply layer 19d, which are inner layers.

Here, in the fourth embodiment, the printed circuit board 100C includes one first ¼ wavelength line and one second ¼ wavelength line 16, which are opposite to a pair of differential transmission lines 12 and 13.

A signal source 11, the pair of differential transmission lines 12 and 13 and a termination resistor 14 are arranged at the signal wiring layer 19a of the substrate 19, while the first ¼ wavelength line 15 and the second ¼ wavelength line 16 are arranged at the other signal wiring layer 19b of the substrate 19. The pair of differential transmission lines 12 and 13, and the first ¼ wavelength line 15 and the second ¼ wavelength line are arranged opposite to each other via insulating layers 19e, 19f and 19g. The ground layer 19c and the power supply layer 19d of the substrate 19 include opening portions 19h and 19i at a position where the differential transmission lines 12 and 13, and the first ¼ wavelength line 15 and the second ¼ wavelength line 16 are opposite to each other. In other words, the pair of differential transmission lines 12 and 13, and the first ¼ wavelength line 15 and the second ¼ wavelength line 16 are arranged close to each other with the insulating layers 19e, 19f and 19g therebetween via the opening portions 19h and 19i. It should be noted that if the wiring layer at which the transmission lines 12 and 13 are arranged, and the wiring layer at which the first ¼ wavelength line 15 and the second ¼ wavelength line 16 are arranged, are arranged adjacent to each other via an insulating layer, it is not necessary to form opening portions in the ground layer and the power supply layer.

As described above, even though the transmission lines 12 and 13, and the ¼ wavelength lines 15 and 16 are arranged at different layers, signals having frequencies that are integral multiples of a basic frequency, which are not necessary for transmission of digital signals in the differential transmission lines 12 and 13, can be removed.

It should be noted that while the fourth embodiment has been described in terms of a case where the printed circuit board 100C provides a circuit for transmitting a differential signal, a transmission line and a ¼ wavelength line may be arranged at different layers also in a printed circuit board configured to transmit a single-ended signal.

Fifth Embodiment

Figure 7A:
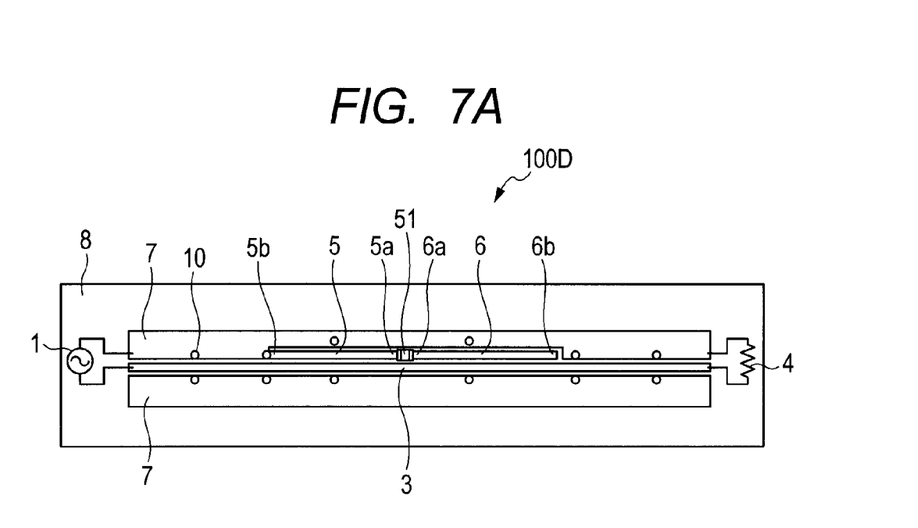
FIGS. 7A and 7B are conceptual diagrams each illustrating a schematic configuration of a printed circuit board according to a fifth embodiment of the present invention.
Figure 7B:
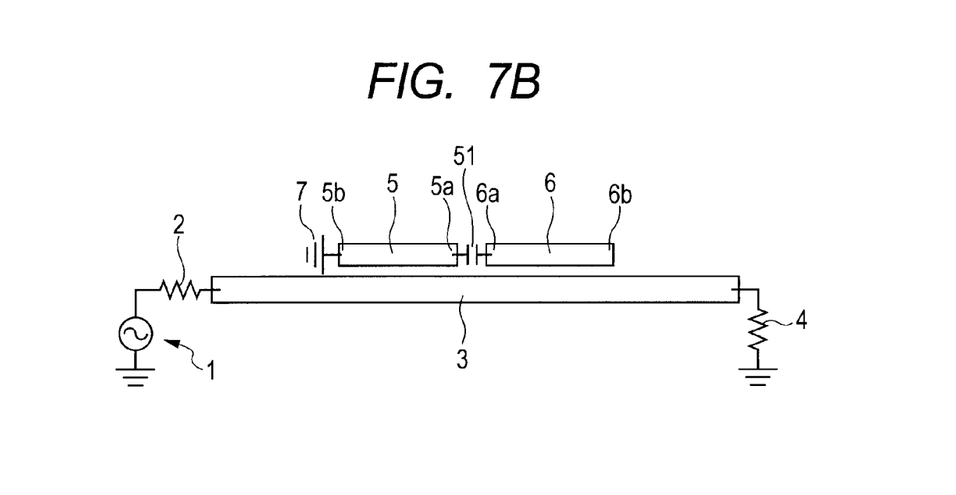

Next, a printed circuit board according to a fifth embodiment of the present invention will be described. FIGS. 7A and 7B are diagrams each illustrating a schematic configuration of the printed circuit board according to the fifth embodiment of the present invention: FIG. 7A is a plan view of the printed circuit board; and FIG. 7B is a schematic diagram of a circuit configuration of the printed circuit board.

As in the first embodiment above, a printed circuit board 100D according to the fifth embodiment includes a signal source 1, which is a signal output port, a termination resistor 4, which is a signal input port, and a transmission line 3 connected between the signal source 1 and the termination resistor 4. Also as in the first embodiment above, the printed circuit board 100D includes a first ¼ wavelength line 5 and a second ¼ wavelength line 6.

The printed circuit board 100D according to the fifth embodiment includes a capacitor 51 as a capacitive element connected between one end 5a of the first ¼ wavelength line 5 and one end 6a of the second ¼ wavelength line 6. Another end 5b of the first ¼ wavelength line 5 is grounded to a ground 7, and another end 6b of the second ¼ wavelength line 6 is opened.

The signal source 1, the termination resistor 4, the lines 3, 5 and 6 and the capacitor 51 are arranged at a signal wiring layer, which is one of surface layers of a substrate 8.

In the above-described configuration, the first ¼ wavelength line 5 functions as a ¼ wavelength line with the other end 5b grounded to the ground, for a basic frequency (0.5 GHz), and provides a characteristic of attenuating the basic frequency. The first ¼ wavelength line 5 also functions as an N/4 wavelength line with the other end 5b grounded to the ground, for a frequency N times (N is an odd number) the basic frequency, and attenuates frequencies that are odd multiples of the basic frequency.

Meanwhile, the second ¼ wavelength line 6 functions as a ½ wavelength line with both ends opened, for a frequency twice the basic frequency, and thus, attenuates a frequency twice the basic frequency. The second ¼ wavelength line 6 also functions as an M/2 wavelength line with both ends opened, for a frequency M times (M is an even number) the basic frequency, and attenuates frequencies that are even multiples of the basic frequency.

Furthermore, the first ¼ wavelength line 5 connected to the second ¼ wavelength line 6 via the capacitor 51 is a line with both ends grounded to a ground, for a frequency M times (M is an even number) of the basic frequency, and functions as an M/2 wavelength line with both ends grounded to a ground, for a frequency M times the basic frequency.

Figure 8A:
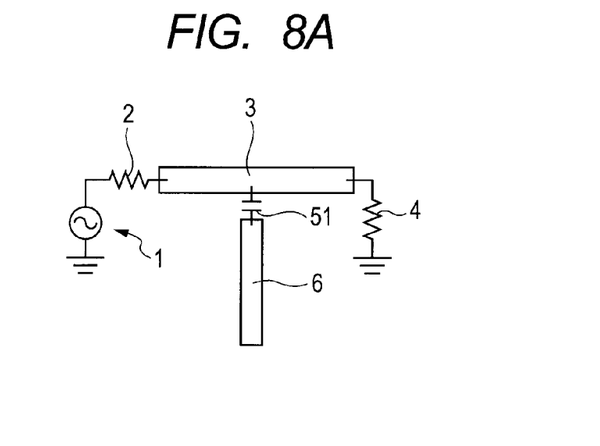
FIG. 8A is a diagram illustrating a model for calculating an impedance characteristic and FIG. 8B is a graph indicating calculation results, respectively, in the fifth embodiment of the present invention.
Figure 8B:
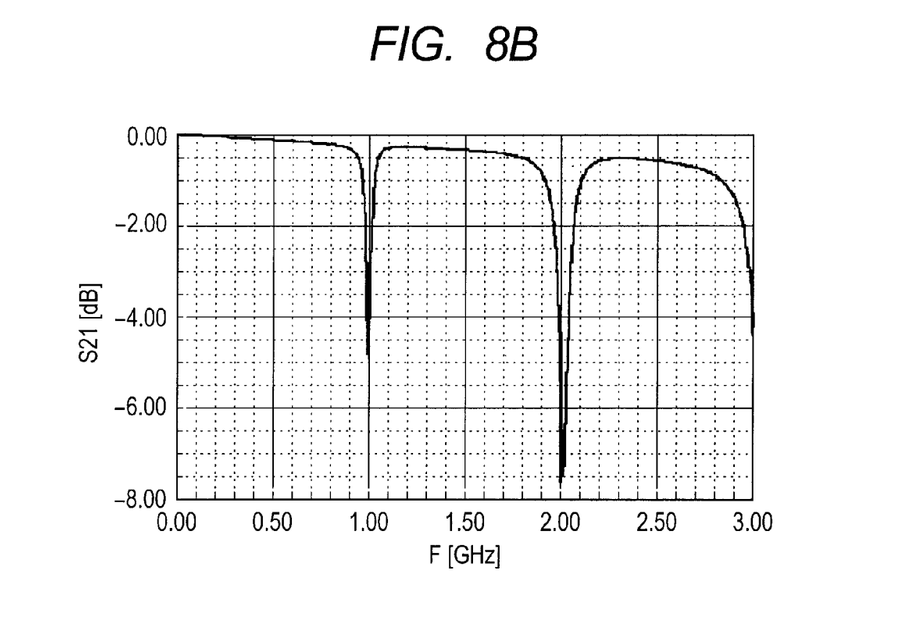

Upon calculation being performed with the configuration illustrated in FIG. 8A, as illustrated in FIG. 8B, the second ¼ wavelength line 6 serially connected to the capacitor 51 exhibits a characteristic of connecting a component having the frequency M times the basic frequency to the ground, and thus, it can be seen that the capacitor 51 functions as an extension capacitor.

As described above, both the first ¼ wavelength line 5 and the second ¼ wavelength line 6 attenuate frequencies that are even multiples of the basic frequency for the principal transmission line 3, and can provide attenuation larger than those of the first to fourth embodiments.

Figure 9A:
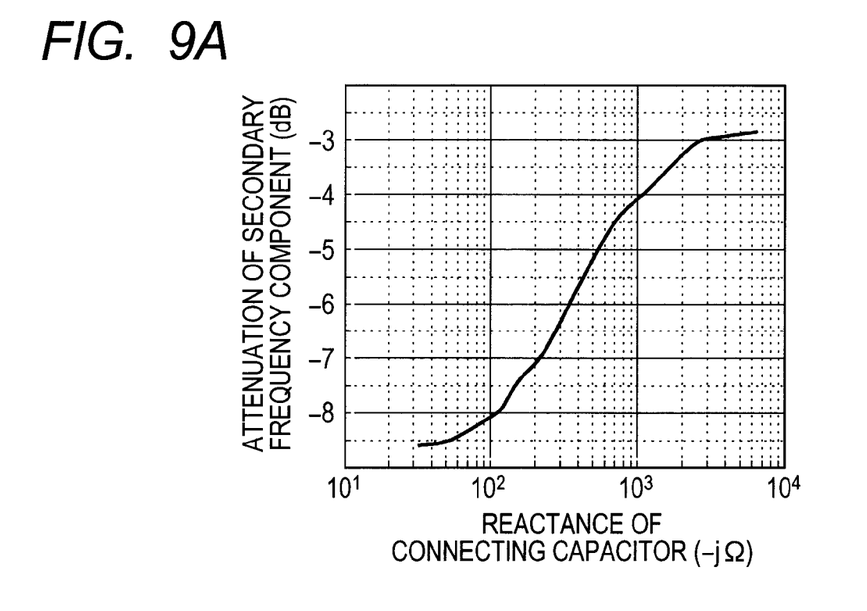
FIGS. 9A and 9B are graphs each indicating a characteristic in the fifth embodiment of the present invention.

FIG. 9A illustrates a relationship between reactance values of the capacitor 51 connecting the first ¼ wavelength line 5 and the second ¼ wavelength line 6, and the amount of attenuation of a component having a frequency twice the basic frequency. As can be seen from FIG. 9A, where the impedance value of the capacitor 51 is no more than 3000Ω for the basic frequency, the amount of attenuation of the component having a frequency twice the basic frequency is increased.

Meanwhile, in the fifth embodiment, the first ¼ wavelength line 5 and the second ¼ wavelength line 6 are connected via the capacitor 51, and thus, optimum electrical lengths of the lines 5 and 6 are both effected by the impedance value of the capacitor 51, and thus, the optimum electrical lengths vary.

Figure 9B:
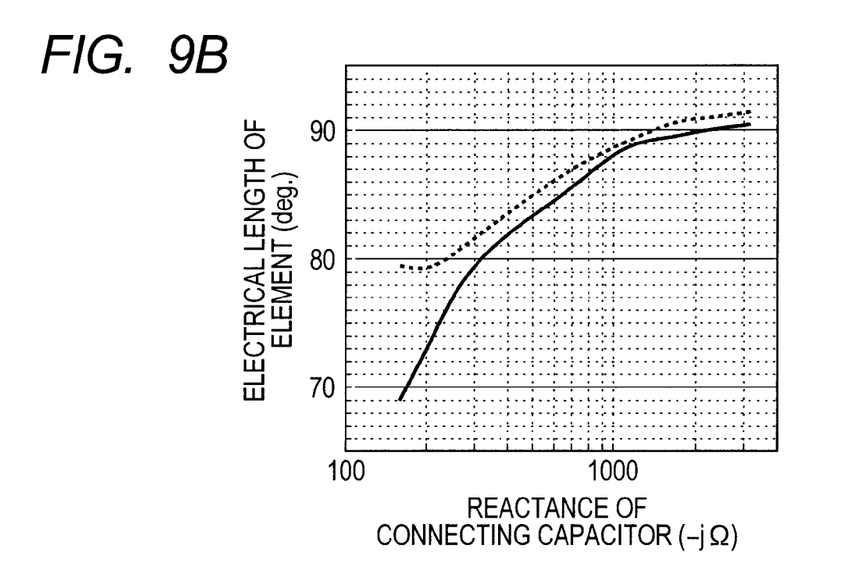

FIG. 9B is a graph indicating optimum electrical lengths of the lines 5 and 6 relative to the impedance value of the capacitor 51. In FIG. 9B, the solid line indicates the optimum electrical length of the first ¼ wavelength line 5, and the dashed line indicates the optimum electrical length of the second ¼ wavelength line 6. In FIG. 9B, where the impedance value of the capacitor 51 is no more than 300Ω, the optimum electrical lengths of the lines 5 and 6 begin to differ from each other, and thus, the optimum electrical lengths of the lines 5 and 6 cannot be determined.

For the above-described reasons, the capacitor 51 can have an impedance value in the range of 300 to 3000Ω for the basic frequency.

Furthermore, the electrical lengths of the lines 5 and 6 can be set in the range of 79 to 91 degrees. In other words, the ¼ wavelength lines 5 and 6 set to have a length that is ¼ of the basic frequency include lines each having a tolerance in the range of no less than 79 degrees and no more than 91 degrees in electrical length.

Figure 10:
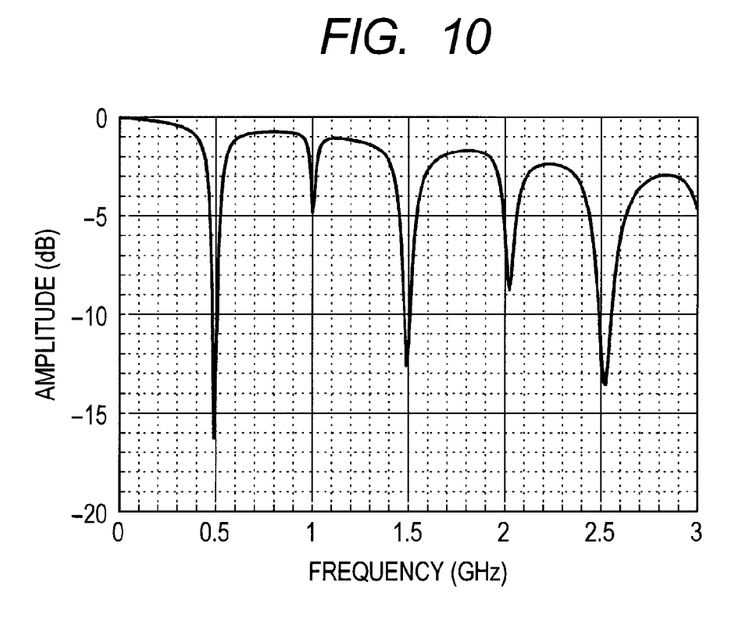
FIG. 10 is a graph indicating results of transmission line attenuation characteristic calculation in the fifth embodiment of the present invention.

FIG. 10 is a graph indicating results of transmission line attenuation characteristic calculation. The calculation was performed assuming that the basic frequency is 0.5 GHz, and the first ¼ wavelength line 5 and the second ¼ wavelength line 6 were formed on a side of a double-sided glass epoxy substrate with a thickness of 1.6 mm. It was also assumed that the first ¼ wavelength line 5 has a length of 83 mm and the second ¼ wavelength line 6 has a length of 83 mm. Also, the calculation was performed assuming that a capacitor 51 of 0.5 pF is connected between the lines 5 and 6. As is clear from FIG. 10, a larger amount of attenuation can be provided for frequencies that are even multiples of the basic frequency, compared to FIG. 3 in the first embodiment.

As described above, the fifth embodiment enables attenuation of components having frequencies that are odd multiples and even multiples of the basic frequency, that is, components having frequencies that are integral multiples of the basic frequency, for the principal transmission line 3. Furthermore, components having frequencies that are even multiples of a basic frequency corresponding to a bit rate of a digital signal transmitted in the transmission line 3 can more effectively be attenuated.

Sixth Embodiment

Figure 11:
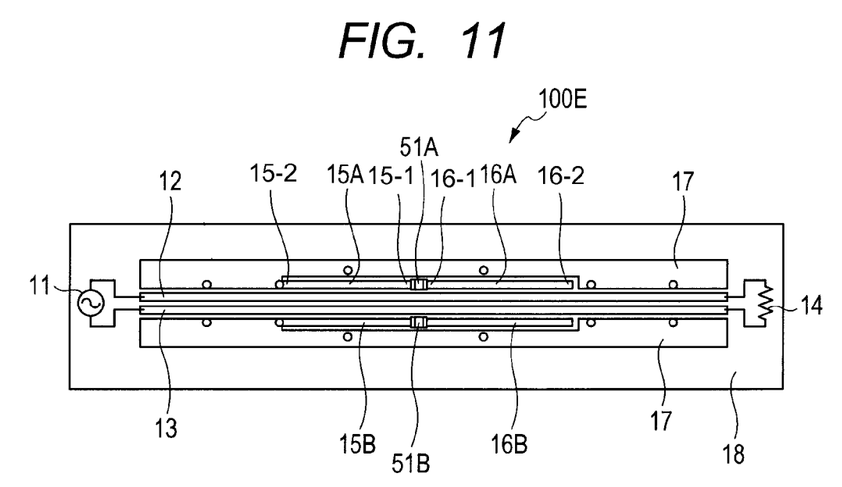
FIG. 11 is a plan view of a printed circuit board according to a sixth embodiment of the present invention.

Next, a printed circuit board according to a sixth embodiment of the present invention will be described. While the fifth embodiment has been described in terms of a case where a single-ended signal is transmitted as a digital signal, the sixth embodiment will be described in terms of a case where a differential signal is transmitted. FIG. 11 is a plan view of the printed circuit board according to the sixth embodiment of the present invention.

In the sixth embodiment, a printed circuit board 100E includes a pair of differential transmission lines 12 and 13 provided at a signal wiring layer, which is one of surface layers of a substrate 18. It is necessary that the pair of the differential transmission lines 12 and 13 be formed so that the differential transmission lines 12 and are closely coupled to each other, and thus, the differential transmission lines 12 and 13 are arranged close to each other and in parallel to each other.

The printed circuit board 100E includes a signal source 11 as a signal output port, and a termination resistor 14 as a signal input port. Digital signals having different polarities are transmitted to the respective differential transmission lines 12 and 13.

In the sixth embodiment, the printed circuit board 100E includes a first ¼ wavelength line 15A and a second ¼ wavelength line 16A, which are arranged adjacent to the transmission line 12. The printed circuit board 100E also includes a first ¼ wavelength line 15B and a second ¼ wavelength line 16B, which are arranged adjacent to the transmission line 13. These lines 12, 13, 15A, 16A, 15B and 16B are interposed between grounds (guard grounds) 17 for reducing electromagnetic radiation leaked from the lines. The grounds 17 are connected to a ground layer, which is an inner layer, via through holes 20.

Furthermore, in the sixth embodiment, the printed circuit board 100E includes capacitors 51A and 51B as capacitive elements, the capacitors 51A and 51B being connected between respective ends 15-1 of the first ¼ wavelength lines 15A and 15B and respective ends 16-1 of the second ¼ wavelength lines 16A and 16B.

The ¼ wavelength lines 15A, 16A, 15B and 16B are each set so as to have a length that is ¼ of a basic frequency corresponding to a bit rate of a digital signal. Another end 15-2 of each of the first ¼ wavelength lines 15A and 15B is grounded to the ground 17. Both ends 16-1 and 16-2 of each of the second ¼ wavelength lines 16A and 16B are opened.

The ¼ wavelength lines 15A, 16A, 15B and 16B each set to have a length that is ¼ of the basic frequency include lines each having a tolerance in the range of no less than 79 degrees and no more than 91 degrees in electrical length, as in the fifth embodiment.

The above-described configuration enables removal of signals having frequencies that are integral multiples of the basic frequency, which are not necessary for transmission of digital signals, for the differential transmission lines 12 and 13, and enables further effective removal of signals having frequencies that are even multiples of the basic frequency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026762, filed Feb. 10, 2011, which is hereby incorporated by reference herein in its entirety.

What is claimed is:

1. A printed circuit board comprising:
a signal output port for outputting a digital signal;
a signal input port for inputting the digital signal;
a transmission line transmitting the digital signal outputted from the signal output port to the signal input port;
a substrate on which the signal output port, the signal input port and the transmission line are arranged;
a first ¼ wavelength line arranged on the substrate substantially in parallel to the transmission line, wherein the first ¼ wavelength line has one end opened and the other end connected to a ground, and a length of the first ¼ wavelength line in a direction parallel to the transmission line is set as ¼ of a wavelength of a basic frequency corresponding to a data rate of the digital signal; and
a second ¼ wavelength line arranged on the substrate substantially in parallel to the transmission line, wherein the second ¼ wavelength line has both ends opened, and a length of the second ¼ wavelength line in the direction parallel to the transmission line is set as ¼ of the wavelength of the basic frequency corresponding to the data rate of the digital signal.

2. The printed circuit board according to claim 1, wherein the substrate is a multi-layer substrate, and the transmission line and the first and second ¼ wavelength lines are formed in the same layer, such that the first and second ¼ wavelength lines are adjacent to the transmission line.

3. The printed circuit board according to claim 1, wherein the substrate is a multi-layer substrate, and the transmission line is formed in a layer different from that or those of the first and second ¼ wavelength lines, such that the first and second ¼ wavelength lines are opposite to the transmission line.

4. A printed circuit board comprising:
a signal output port for outputting a digital signal;
a signal input port for inputting the digital signal;
a transmission line transmitting the digital signal outputted from the signal output port to the signal input port;
a substrate on which the signal output port, the signal input port and the transmission line are arranged;
a first ¼ wavelength line arranged on the substrate substantially in parallel to the transmission line, wherein the first ¼ wavelength line has one end opened and the other end connected to a ground, and a length of the first ¼ wavelength line in the direction parallel to the transmission line is set as ¼ of a wavelength of a basic frequency corresponding to a data rate of the digital signal; and
a second ¼ wavelength line arranged on the substrate substantially in parallel to the transmission line, wherein the second ¼ wavelength line has both ends grounded, and a length of the second ¼ wavelength line in the direction parallel to the transmission line is set as ¼ of the wavelength of the basic frequency corresponding to the data rate of the digital signal.

5. The printed circuit board according to claim 4, wherein the substrate is a multi-layer substrate, and the transmission line and the first and second ¼ wavelength lines are formed in the same layer, such that the first and second ¼ wavelength lines are adjacent to the transmission line.

6. The printed circuit board according to claim 4, wherein the substrate is a multi-layer substrate, and the transmission line is formed in a layer different from that or those of the first and second ¼ wavelength lines, such that the first and second ¼ wavelength lines are opposite to the transmission line.

7. A printed circuit board comprising:
a signal output port for outputting a digital signal;
a signal input port for inputting the digital signal;
a transmission line transmitting the digital signal outputted from the signal output port to the signal input port;
a substrate on which the signal output port, the signal input port and the transmission line are arranged;
a first ¼ wavelength line arranged on the substrate substantially in parallel to the transmission line; and
a second ¼ wavelength line arranged on the substrate substantially in parallel to the transmission line, wherein a capacitive element is connected between one end of the first ¼ wavelength line and one end of the second ¼ wavelength line,
the other end of the first ¼ wavelength line is grounded, and
the other end of the second ¼ wavelength line is opened.

8. The printed circuit board according to claim 7, wherein the substrate is a multi-layer substrate, and the transmission line and the first and second ¼ wavelength lines are formed in the same layer, such that the first and second ¼ wavelength lines are adjacent to the transmission line.

9. The printed circuit board according to claim 7, wherein the substrate is a multi-layer substrate, and the transmission line is formed in a layer different from that or those of the first and second ¼ wavelength lines, such that the first and second ¼ wavelength lines are opposite to the transmission line.

* * * * *